US012740353B2

(12) United States Patent
Ike et al.

(10) Patent No.: US 12,740,353 B2
(45) Date of Patent: Sep. 15, 2026

(54) FILM FORMATION METHOD

(71) Applicant: Tokyo Electron Limited, Tokyo (JP)

(72) Inventors: Shinichi Ike, Hwaseong-si (KR); Shuji Azumo, Nirasaki (JP); Yumiko Kawano, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 468 days.

(21) Appl. No.: 18/255,133

(22) PCT Filed: Nov. 25, 2021

(86) PCT No.: PCT/JP2021/043132
§ 371 (c)(1),
(2) Date: May 31, 2023

(87) PCT Pub. No.: WO2022/124087
PCT Pub. Date: Jun. 16, 2022

(65) Prior Publication Data

US 2024/0030025 A1 Jan. 25, 2024

(30) Foreign Application Priority Data

Dec. 9, 2020 (JP) ................................ 2020-204403

(51) Int. Cl.
*H10P 14/60* (2026.01)
*H10P 14/692* (2026.01)
(Continued)

(52) U.S. Cl.
CPC ...... *H10P 14/6339* (2026.01); *H10P 14/6506* (2026.01); *H10P 14/69215* (2026.01);
(Continued)

(58) Field of Classification Search
CPC ........... H01L 21/0228; H01L 21/02164; H01L 21/02304; H01L 21/31116;
(Continued)

(56) References Cited

U.S. PATENT DOCUMENTS

2019/0295870 A1* 9/2019 Tapily ............... H01L 21/67207

FOREIGN PATENT DOCUMENTS

| | | | |
|---|---|---|---|
| JP | 2007-501902 A | 2/2007 | |
| JP | 2007-533156 A | 11/2007 | |
| JP | 2010-540773 A | 12/2010 | |
| JP | 2013-520028 A | 5/2013 | |
| WO | WO-2020184212 A1 * | 9/2020 | ....... H01L 21/76849 |

OTHER PUBLICATIONS

Fang et al., "Area-Selective Atomic Layer Deposition: Conformal Coating, Subnanometer Thickness Control, and Smart Positioning", ACS Nano, 2015, vol. 9, No. 9, pp. 8651-8654.

(Continued)

*Primary Examiner* — Dale E Page
*Assistant Examiner* — Quovaunda Jefferson
(74) *Attorney, Agent, or Firm* — Armstrong Teasdale LLP

(57) ABSTRACT

A film formation method of selectively forming a film on a substrate includes: a preparation process of preparing the substrate having a first film and a second film exposed on a surface thereof; a first film formation process of forming a self-assembled monolayer on the first film by supplying, onto the substrate, a compound for forming the self-assembled monolayer that has a functional group not containing fluorine and containing an alkyl group and prevents formation of a third film; a second film formation process of forming the third film on the second film; and a first removal process of removing the third film formed in a vicinity of the self-assembled monolayer by applying energy to the surface, wherein the third film is a film that is more likely than the first film to combine with hydrogen and carbon contained in the self-assembled monolayer to form a volatile compound.

15 Claims, 12 Drawing Sheets

(51) Int. Cl.
*H10P 50/28* (2026.01)
*H10W 20/00* (2026.01)

(52) U.S. Cl.
CPC ......... *H10P 50/283* (2026.01); *H10W 20/077* (2026.01); *H10P 50/287* (2026.01)

(58) Field of Classification Search
CPC ......... H01L 21/76834; H01L 21/31138; H01L 21/321; H01L 21/02178; H01L 21/012211; H01L 21/32; C23C 16/04; C23C 16/455; C23C 16/401; C23C 16/56; B05D 1/322; B05D 1/62; B05D 1/56; H10P 14/6339; H10P 14/6506; H10P 14/69215; H10P 14/61; H10P 14/6682; H10P 14/69391; H10P 50/283; H10P 50/287; H10P 95/00; H10W 20/077
See application file for complete search history.

(56) References Cited

OTHER PUBLICATIONS

Hashemi et al., "Selective Deposition of Dielectrics: Limits and Advantages of Alkanethiol Blocking Agents on Metal-Dielectric Patterns", ACS Appl. Mater. Interfaces, 2016, vol. 8, No. 48, pp. 33264-33272.

Mackus et al., "From the Bottom-Up: Toward Area-Selective Atomic Layer Deposition with High Selectivity", Chem. Mater., 2019, vol. 31, No. 1, pp. 2-12.

Oehrlein et al, "Atomic Layer Etching at the Tipping Point: An Overview", ECS J. Solid State Sci. Technol., 2015, vol. 4, No. 6, pp. N5041-N5053.

* cited by examiner

Figure 18:
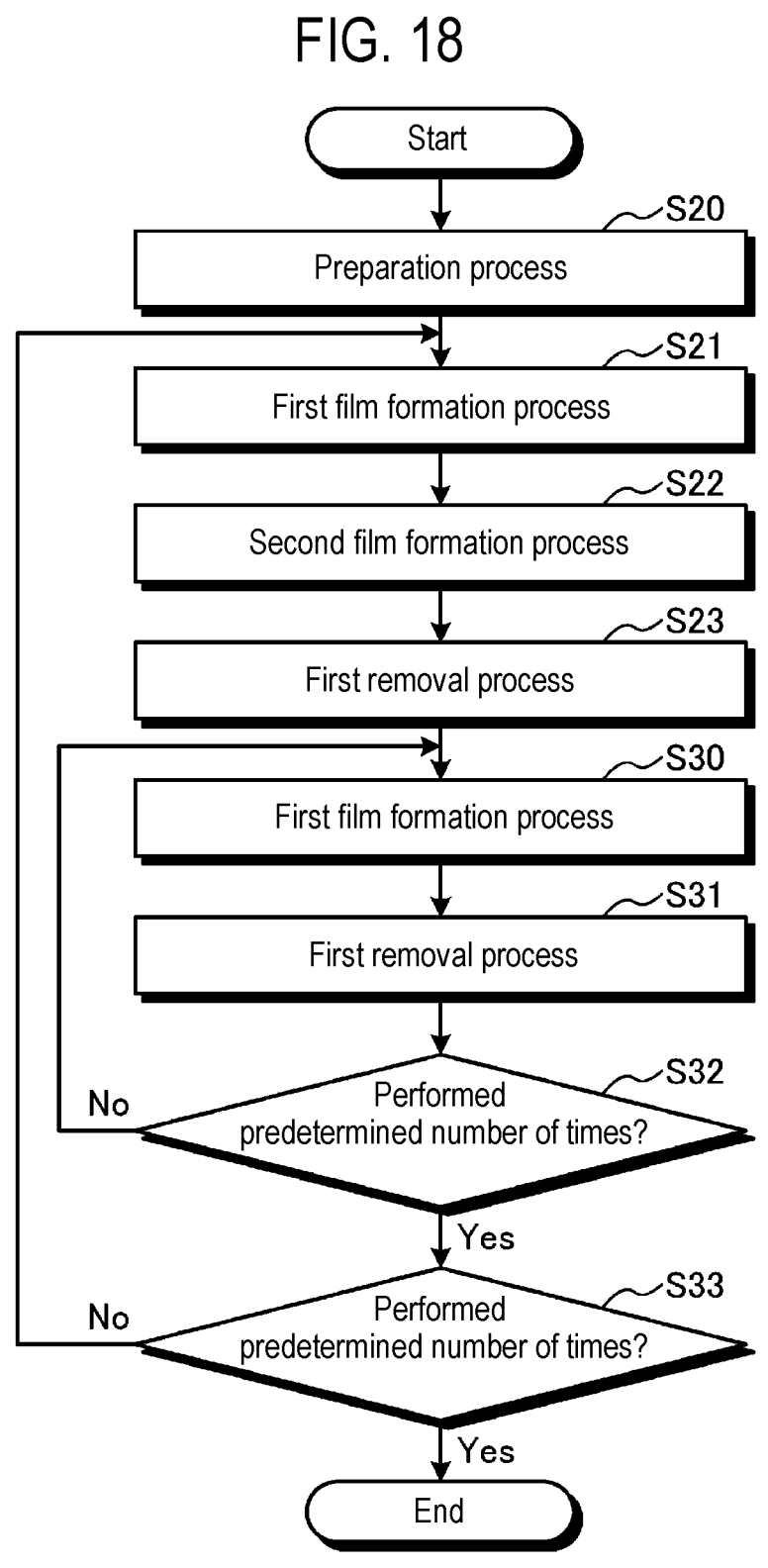

Start
S20 Preparation process
S21 First film formation process
S22 Second film formation process
S23 First removal process
S30 First film formation process
S31 First removal process
S32 Performed predetermined number of times? (No → S30; Yes → S33)
S33 Performed predetermined number of times? (No → S21; Yes → End)
End

FILM FORMATION METHOD

CROSS-REFERENCE TO RELATED APPLICATIONS

The present application is a U.S. National Stage Entry of International Patent Application No. PCT/JP2021/043132, filed Nov. 25, 2021, which claims the benefit of priority to Japanese Patent Application No. 2020-204403, filed Dec. 9, 2020, each of which is hereby incorporated herein by reference in its entirety.

TECHNICAL FIELD

Various aspects and embodiments of the present disclosure relate to a film formation method.

BACKGROUND

In the manufacture of semiconductor devices, a photography technique is widely used as a technique to selectively form a film in a specific region of the surface of a substrate. For example, after forming a lower layer wiring, an insulating film is formed, a dual damascene structure having trenches and via holes is formed by photolithography and etching, and a conductive film such as Cu is embedded in the trenches and via holes to form a wiring.

However, in recent years, the miniaturization of semiconductor devices has progressed more and more, and there are cases where alignment accuracy is not sufficient in a photolithography technique.

For this reason, there is a demand for a method of selectively forming a film in a specific region of the surface of a substrate without using the photolithography technique. A technique of forming a self-assembled monolayer (SAM) in a region of the surface of a substrate where film formation is not desired has been proposed (for example, see Patent Documents 1 to 4 and Non-Patent Documents 1 to 4). Since no predetermined film is formed in the region of the surface of the substrate where the SAM is formed, a predetermined film may be formed only in a region of the surface of the substrate where the SAM is not formed.

PRIOR ART DOCUMENTS

Patent Documents

Patent Document 1: Japanese Laid-Open Publication No. 2007-501902

Patent Document 2: Japanese Laid-Open Publication No. 2007-533156

Patent Document 3: Japanese Laid-Open Publication No. 2010-540773

Patent Document 4: Japanese Laid-Open Publication No. 2013-520028

Non-Patent Documents

Non-Patent Document 1: G. S. Oehrlein, D. Metzler, and C. Li "Atomic Layer Etching at the Tipping Point: An Overview" ECS J. Solid State Sci. Technol. 2015 vol. 4 no. 6 N5041-N5053

Non-Patent Document 2: Ming Fang and Johnny C. Ho "Area-Selective Atomic Layer Deposition: Conformal Coating, Subnanometer Thickness Control, and Smart Positioning" ACS Nano, 2015, 9(9), pp 8651-8654

Non-Patent Document 3: Adriaan J. M. Mackus, Marc J. M. Merkx, and Wilhelmus M. M. Kessels "From the Bottom-Up: Toward Area-Selective Atomic Layer Deposition with High Selectivity" Chem. Mater., 2019, 31(1), pp 2-12

Non-Patent Document 4: Fatemeh Sadat Minaye Hashemi, Bradlee R. Birchansky, and Stacey F. Bent "Selective Deposition of Dielectrics: Limits and Advantages of Alkanethiol Blocking Agents on Metal-Dielectric Patterns" ACS Appl. Mater. Interfaces, 2016, 8(48), pp 33264-33272

The present disclosure provides a film formation method capable of improving the productivity of semiconductor devices using selective film formation.

SUMMARY

One aspect of the present disclosure is a film formation method of selectively forming a film on a substrate, the method including a preparation process, a first film formation process, a second film formation process, and a first removal process. In the preparation process, the substrate having a first film and a second film exposed on a surface of the substrate is prepared. In the first film formation process, a self-assembled monolayer is formed on the first film by supplying, onto the substrate, a compound for forming the self-assembled monolayer that has a functional-group not containing fluorine and containing an alkyl group and prevents formation of a third film. In the second film formation process, the third film is formed on the second film. In the first removal process, the third film formed in a vicinity of the self-assembled monolayer is removed by applying energy to the surface of the substrate. Further, the third film is a film that is more likely than the first film to combine with hydrogen and carbon contained in the self-assembled monolayer to form a volatile compound.

According to various aspects and embodiments of the present disclosure, it is possible to improve the productivity of semiconductor devices using selective film formation.

BRIEF DESCRIPTION OF DRAWINGS

FIG. 18 is a flowchart illustrating still another example of the film formation method according to the second embodiment.

DETAILED DESCRIPTION

Hereinafter, embodiments of a film formation method disclosed herein will be described in detail based on the drawings. In addition, the disclosed film formation method is not limited by the following embodiments.

Conventionally, in selective film formation, a substrate having a metal film and an insulating film exposed on a surface thereof is prepared, and a SAM that prevents the formation of an oxide film is formed on the metal film. Then, an oxide film is formed on the insulating film. At this time, since the formation of the oxide film on the metal film is prevented by the SAM, no oxide film is formed on the metal film.

However, since the ability of the SAM to prevent the formation of the oxide film is not perfect, there are cases where nuclei of the oxide film that may serve as a growth starting point are also formed on the SAM. Thus, if the formation of the oxide film is continued, the oxide film will also be formed on the SAM. Therefore, it is necessary to remove the nuclei of the oxide film formed on the SAM when the formation of the oxide film on the insulating film progresses to some extent. After the nuclei of the oxide film on the SAM are removed, the metal film is replenished with the SAM, and the oxide film is formed again on the insulating film. If the SAM remains on the metal film after the nuclei of the oxide film on the SAM are removed, the SAM remaining on the metal film is removed, and then, the metal film is replenished with the SAM, and the oxide film is formed again on the insulating film. By repeating the formation of the oxide film, the removal of the nuclei on the SAM, and the replenishment of the SAM in this order, the oxide film having a desired thickness may be formed on the insulating film.

Here, the nuclei of the oxide film formed on the SAM may be removed by etching using, for example, a fluorocarbon-based gas. However, since the fluorocarbon-based gas is supplied to the entire substrate, the oxide film formed on the insulating film is also etched, which reduces the film thickness of the oxide film. Therefore, even though the formation of the oxide film, the removal of the nuclei on the SAM, and the replenishment of the SAM are repeated, the film thickness of the oxide film formed on the insulating film does not easily reach the desired film thickness. Accordingly, there is a demand for an improvement in the productivity of the entire processing of selectively forming an oxide film having a desired film thickness only on an insulating film.

Therefore, the present disclosure provides a technology capable of improving the productivity of semiconductor devices using selective film formation.

First Embodiment

[Film Formation System 100]

Figure 1:
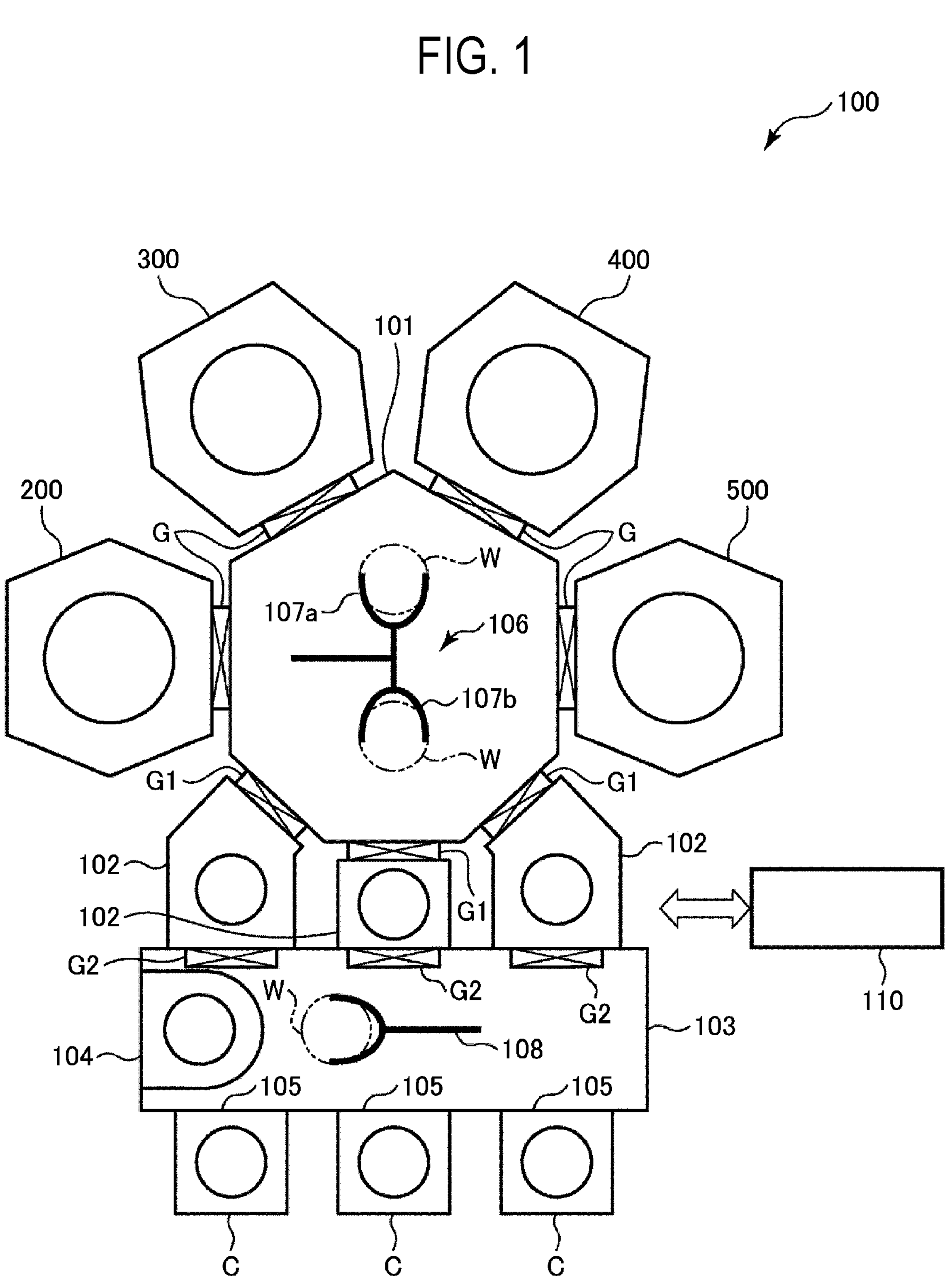
FIG. 1 is a schematic diagram illustrating an example of a film formation system according to an embodiment of the present disclosure.

FIG. 1 is a schematic diagram illustrating an example of a film formation system 100 according to an embodiment of the present disclosure. The film formation system 100 includes a SAM supply apparatus 200, a film forming apparatus 300, a plasma processing apparatus 400 and a plasma processing apparatus 500. These apparatuses are connected respectively via gate valves G to four sidewalls of a vacuum transfer chamber 101 having a heptagonal planar shape. The film formation system 100 is a multi-chamber-type vacuum processing system. The interior of the vacuum transfer chamber 101 is evacuated by a vacuum pump and is maintained at a predetermined degree of vacuum. The film formation system 100 uses the SAM supply apparatus 200, the film forming apparatus 300, the plasma processing apparatus 400, and the plasma processing apparatus 500 to selectively form a third film on a second film of a substrate W having a first film and the second film exposed on a surface thereof.

The SAM supply apparatus 200 supplies an organic compound gas for the formation of a SAM to the surface of the substrate W, thereby forming a SAM in a first film region of the substrate W. In the present embodiment, the SAM has a function of being adsorbed to a surface of the first film to prevent the formation of the third film.

In the present embodiment, the organic compound for forming the SAM has a functional-group that does not contain fluorine and contains an alkyl group. The organic compound for forming the SAM is an organic compound including, for example, a binding functional-group that is adsorbed to the surface of the first film, a functional functional-group that does not contain fluorine and contains an alkyl group, and an alkyl chain that connects the binding functional-group to the functional functional-group.

When the first film is, for example, gold, copper, or the like, for example, a thiol-based compound represented by the general formula "R—SH" may be used as the organic compound for forming the SAM. Here, "R" does not include fluorine, but includes a hydrogen atom and a carbon atom. The thiol-based compound has a property of being adsorbed to a surface of a metal such as gold or copper but not adsorbed to a surface of an oxide or carbon. For example, $CH_3(CH_3)_{16}CH_2SH$, $CH_3(CH_2)_{10}CH_2SH$, $CH_3(CH_2)_4CH_2SH$, $HS—(CH_2)_{11}—O—(CH_2)_2—(CF_2)_5—CF_3$, $HS—(CH_2)_{11}—O—CH_2—C_6F_5$ or the like may be used as such a thiol-based compound.

In addition, when the first film is, for example, a silicon nitride film or the like, for example, an organic silane-based compound represented by the general formula "$R—Si(OCH_3)_3$" or "$R—SiCl_3$" may be used as the organic compound for forming the SAM. Further, when the first film is, for example, an aluminum oxide or the like, for example, a phosphonic acid-based compound represented by the general formula "$R—P(=)(OH)_2$" may be used as the organic compound for forming the SAM. Further, when the first film is, for example, a tantalum oxide or the like, for example, an isocyanate-based compound represented by the general formula "R—N═C═O" may be used as the organic compound for forming the SAM.

In the present embodiment, the first film is a film that is more likely than the second film to adsorb the SAM. Further, the third film is a film that is more likely than the first film to combine with hydrogen and carbon contained in the SAM to form a volatile compound. The following Tables 1 to 4 show conceivable combinations of materials for the first film, the second film, the third film, and the SAM.

TABLE 1

| SAM | First Film | Second Film | Third Film |
|---|---|---|---|
| thiol-based compound | copper | silicon nitride film | silicon |
| | gold | silicon oxide film | silicon nitride film |
| | silver | aluminum oxide | silicon oxide film |
| | platinum | hafnium oxide | titanium nitride |
| | palladium | titanium nitride | titanium oxide |
| | iron | titanium oxide | tungsten oxide |
| | nickel | nickel oxide | tantalum oxide |
| | zinc | chromium oxide | spin on carbon |
| | GaAS | iron oxide | ruthenium |
| | InP | manganese oxide | aluminum oxide |
| | GaN | niobium oxide | aluminum |
| | halogenated silicon | zirconium oxide | titanium |
| | ruthenium | tungsten oxide | tungsten |
| | | tantalum oxide | |
| | | silver oxide | |
| | | copper oxide | |
| | | tin oxide | |
| | | PZT | |
| | | ITO | |
| | | spin on carbon | |
| | | aluminum | |
| | | hafnium | |
| | | titanium | |
| | | chrome | |
| | | manganese | |
| | | niobium | |
| | | zirconium | |
| | | tungsten | |
| | | tantalum nitride | |

TABLE 2

| SAM | First Film | Second Film | Third Film |
|---|---|---|---|
| organosilane-based compound | silicon nitride film | copper | silicon |
| | silicon oxide film | gold | silicon nitride film |
| | halogenated silicon | silver | silicon oxide film |
| | aluminum oxide | platinum | titanium nitride |
| | hafnium oxide | palladium | titanium oxide |
| | titanium nitride | iron | tungsten oxide |
| | titanium oxide | nickel | tantalum oxide |
| | nickel oxide | zinc | spin on carbon |
| | chromium oxide | GaAs | ruthenium |
| | iron oxide | InP | aluminum oxide |
| | manganese oxide | GaN | aluminum |
| | niobium oxide | ruthenium | titanium |
| | zirconium oxide | aluminum | tungsten |
| | tungsten oxide | hafnium | |
| | tantalum oxide | titanium | |
| | silver oxide | chrome | |
| | copper oxide | manganese | |
| | tin oxide | niobium | |
| | PZT | zirconium | |
| | ITO | tungsten | |
| | germanium oxide | | |
| | spin on carbon | | |
| | ruthenium | | |

TABLE 3

| SAM | First Film | Second Film | Third Film |
|---|---|---|---|
| Phosphonic acid-based compound | copper | gold | silicon |
| | halogenated silicon | silver | silicon nitride film |
| | aluminum oxide | platinum | silicon oxide film |
| | hafnium oxide | palladium | titanium nitride |
| | titanium oxide | nickel | titanium oxide |
| | nickel oxide | zinc | tungsten oxide |
| | chromium oxide | GaAs | tantalum oxide |
| | iron oxide | InP | spin on carbon |

TABLE 3-continued

| SAM | First Film | Second Film | Third Film |
|---|---|---|---|
| | manganese oxide<br>niobium oxide<br>zirconium oxide<br>tungsten oxide<br>spin on carbon<br>ruthenium<br>aluminum<br>hafnium<br>titanium<br>nickel<br>chrome<br>iron<br>manganese<br>niobium<br>zirconium<br>tungsten | GaN<br>silicon nitride film<br>silicon oxide film | ruthenium<br>aluminum oxide<br>aluminum<br>titanium<br>tungsten |

TABLE 4

| SAM | First Film | Second Film | Third Film |
|---|---|---|---|
| isocyanate-based compound | halogenated silicon<br>silicon oxide film<br>aluminum oxide<br>hafnium oxide<br>titanium oxide<br>nickel oxide<br>chromium oxide<br>iron oxide<br>manganese oxide<br>niobium oxide<br>zirconium oxide<br>tungsten oxide<br>tantalum oxide<br>silver oxide<br>copper oxide<br>tin oxide<br>spin on carbon<br>ITO | copper<br>gold<br>silver<br>platinum<br>palladium<br>iron<br>nickel<br>zinc<br>GaAs<br>InP<br>GaN<br>PZT<br>silicon nitride film<br>ITO<br>ruthenium<br>iron oxide<br>aluminum<br>hafnium<br>titanium<br>chrome<br>manganese<br>niobium<br>zirconium<br>tungsten | silicon<br>silicon nitride film<br>silicon oxide film<br>titanium nitride<br>titanium oxide<br>tungsten oxide<br>tantalum oxide<br>spin on carbon<br>ruthenium<br>aluminum oxide<br>aluminum<br>titanium<br>tungsten |

In addition, in the combinations illustrated in the above Tables 1 to 4, it is assumed that the material of the first film and the material of the second film are different and that the material of the first film and the material of the third film are different.

The film forming apparatus 300 forms the third film on the second film of the substrate W on which the SAM is formed by the SAM supply apparatus 200. In the present embodiment, the film forming apparatus 300 forms the third film in a second film region of the substrate W by atomic layer deposition (ALD) using a raw material gas and a reaction gas. For example, a gas such as a silane chloride or dimethyl silane chloride may be used as the raw material gas. For example, a $H_2O$ gas, $N_2O$ gas, or the like may be used as the reaction gas.

The plasma processing apparatus 400 applies energy to the surface of the substrate W on which the third film is formed by the film forming apparatus 300. In the present embodiment, the plasma processing apparatus 400 applies energy to the surface of the substrate W by irradiating the surface of the substrate W with at least one of ions and active species. In the present embodiment, the plasma processing apparatus 400 irradiates the surface of the substrate W with ions and active species contained in plasma by exposing the substrate W to the plasma generated by plasmatizing a noble gas such as an Ar gas. In addition, the plasma may be generated using plural types of noble gases (for example, a He gas and an Ar gas). Further, the plasma may be generated using a gas including at least one of a noble gas, hydrogen gas, nitrogen gas, and ammonia gas.

The plasma processing apparatus 500 removes the SAM remaining on the first film by further plasma-exposing the surface of the substrate W to which the energy is applied by the plasma processing apparatus 400. In the present embodiment, the plasma processing apparatus 500 removes the SAM remaining on the first film by, for example, generating plasma using a hydrogen gas and exposing the surface of the substrate W to the hydrogen gas plasma. In addition, the plasma processing apparatus 500 may remove the SAM remaining on the first film using plasma of another gas such as an oxygen gas. Further, the SAM remaining on the first film may be removed using a highly reactive gas such as an ozone gas without using plasma.

Three other sidewalls of the vacuum transfer chamber 101 are connected to three load lock chambers 102 via gate valves G1. An atmospheric transfer chamber 103 is provided on the opposite side of the vacuum transfer chamber 101 with the load lock chambers 102 interposed therebetween. Each of the three load lock chambers 102 is connected to the atmospheric transfer chamber 103 via a gate valve G2. The load lock chambers 102 perform pressure control between the atmospheric pressure and vacuum when transferring the substrate W between the atmospheric transfer chamber 103 and the vacuum transfer chamber 101.

Three ports 105 for attaching a carrier (Front-Opening Unified Pod (FOUP) or the like) C accommodating the substrate W therein are provided on the side of the atmospheric transfer chamber 103 opposite to the side on which the gate valve G2 is provided. Further, an alignment chamber 104 for aligning the substrate W is provided on a sidewall of the atmospheric transfer chamber 103. A downflow of clean air is created within the atmospheric transfer chamber 103.

A transfer mechanism 106 such as a robot arm is provided within the vacuum transfer chamber 101. The transfer mechanism 106 transfers the substrate W between the SAM supply apparatus 200, the film forming apparatus 300, the plasma processing apparatus 400, the plasma processing apparatus 500, and each load lock chamber 102. The transfer mechanism 106 includes two independently movable arms 107*a* and 107*b*.

A transfer mechanism 108 such as a robot arm is provided in the atmospheric transfer chamber 103. The transfer mechanism 108 transfers the substrate W between each carrier C, each load lock chamber 102, and the alignment chamber 104.

The film formation system 100 includes a control device 110 having a memory, a processor, and an input/output interface. The memory stores programs executed by the processor and recipes including, for example, conditions for each processing. The processor executes the programs read from the memory, and controls each part of the film formation system 100 via the input/output interface based on the recipes stored in the memory.

[Film Formation Method]

Figure 2:
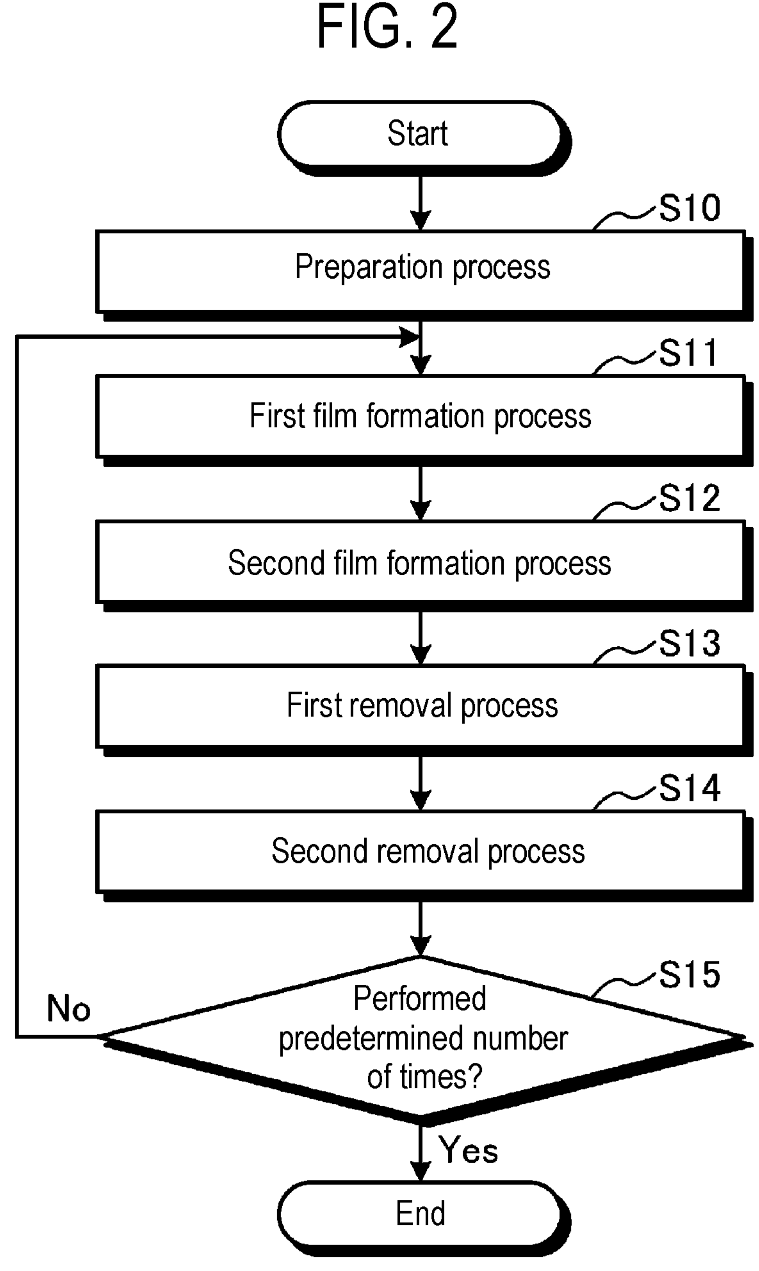
FIG. 2 is a flowchart illustrating an example of a film formation method according to a first embodiment.

FIG. 2 is a flowchart illustrating an example of a film formation method according to a first embodiment. In the present embodiment, for example, in the substrate W having the first film and the second film exposed on the surface thereof, the third film is selectively formed on the second film by the film formation system 100 illustrated in FIG. 1. The film formation method illustrated in the flowchart of FIG. 2 is realized by controlling each part of the film formation system 100 by the control device 110. Hereinafter, an example of the film formation method according to the first embodiment will be described with reference to FIGS. 3 to 8.

Figure 3:
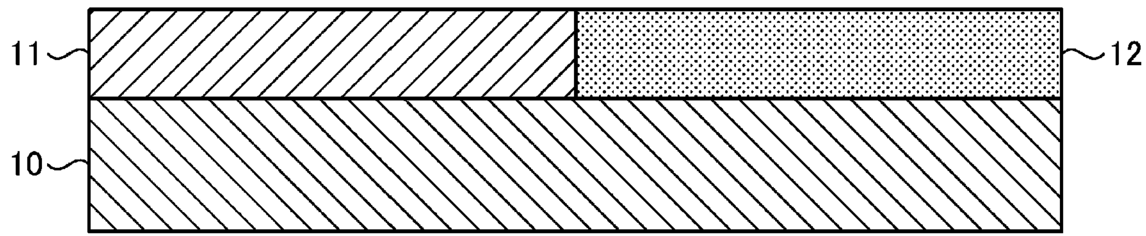
FIG. 3 is a cross-sectional view illustrating an example of a substrate prepared in a preparation process according to the first embodiment.

First, a preparation process is performed (S10). In the preparation process of step S10, for example, the substrate W having a first film 11 and a second film 12 on a base material 10 is prepared, as illustrated in FIG. 3. FIG. 3 is a cross-sectional view illustrating an example of the substrate W prepared in the preparation process according to the first embodiment. In the present embodiment, the base material 10 is, for example, silicon, the first film 11 is, for example, a metal film such as copper, and the second film 12 is, for example, an insulating film such as a silicon oxide film.

The substrate W prepared in step S10 is accommodated in the carrier C and is set in the port 105. Then, the substrate W is taken out from the carrier C, passes through the alignment chamber 104, and then is loaded into one of the load lock chambers 102 by the transfer mechanism 108. Then, after the interior of the load lock chamber 102 is evacuated, the substrate W is unloaded from the load lock chamber 102 and is loaded into the SAM supply apparatus 200 by the transfer mechanism 106.

Subsequently, a first film formation process is performed (S11). In the first film formation process of step S11, an organic compound gas for forming a SAM is supplied into the SAM supply apparatus 200 into which the substrate W is loaded. Molecules of the organic compound supplied into the SAM supply apparatus 200 are not adsorbed to a surface of the second film 12 but are adsorbed to a surface of the first film 11 on the substrate W to form a SAM on the first film 11. Main processing conditions in the first film formation process of step S11 are, for example, as follows.

Temperature of the substrate W: 100 to 350 degrees C. (particularly 150 degrees C.)
Pressure: 1 to 100 Torr (particularly 50 Torr)
Flow rate of the organic compound gas: 50 to 500 sccm (particularly 250 sccm)
Processing time: 10 to 300 seconds (particularly 30 seconds)

Figure 4:
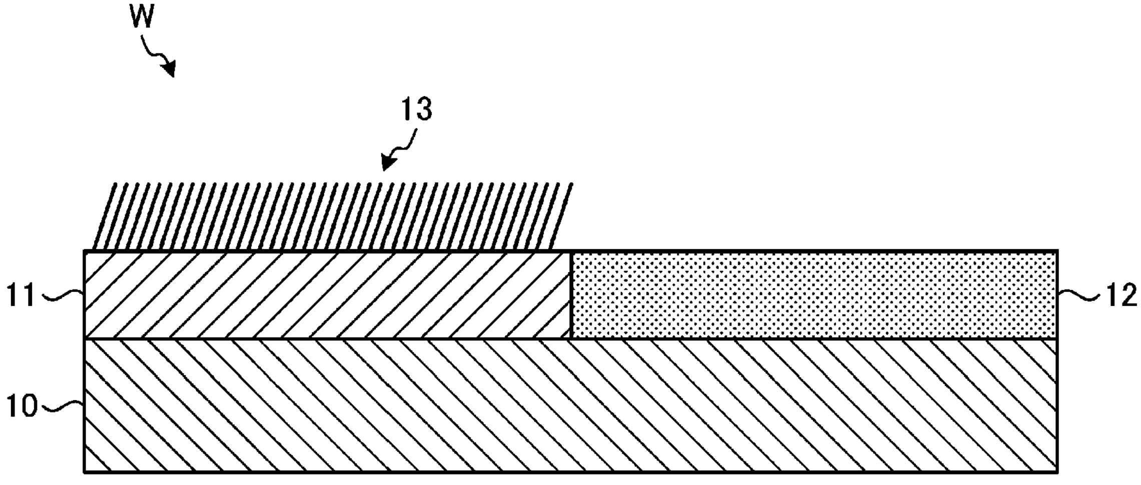
FIG. 4 is a cross-sectional view illustrating an example of the substrate after a SAM is formed on a first film according to the first embodiment.

Thereby, the substrate W reaches, for example, the state as illustrated in FIG. 4. FIG. 4 is a cross-sectional view illustrating an example of the substrate W after a SAM 13 is formed on the first film 11 according to the first embodiment. After the processing of step S11 is performed, the substrate W is unloaded from the SAM supply apparatus 200 and is loaded into the film forming apparatus 300 by the transfer mechanism 106.

Subsequently, a second film formation process is performed (S12). In the second film formation process of step S12, a third film such as an oxide film is formed on the substrate W by ALD in the film forming apparatus 300 into which the substrate W is loaded. In the present embodiment, the third film formed on the substrate W by ALD is, for example, a silicon oxide film. In ALD, an ALD cycle including an adsorption process, a first purge process, a reaction process, and a second purge process is performed a predetermined number of times.

In the adsorption process, a raw material gas such as a silane chloride gas is supplied into the film forming apparatus 300. Thus, molecules of the raw material gas are chemically adsorbed to the surface of the second film 12. However, the molecules of the raw material gas are hardly adsorbed onto the SAM 13. Main processing conditions in the adsorption process are, for example, as follows.

Temperature of the substrate W: 100 to 350 degrees C. (particularly 200 degrees C.)
Pressure: 1 to 10 Torr (particularly 5 Torr)
Flow rate of the raw material gas: 10 to 500 sccm (particularly 250 sccm)
Processing time: 0.3 to 10 seconds (particularly 1 second)

In the first purge process, an inert gas such as a nitrogen gas is supplied into the film forming apparatus 300 to remove the excessively adsorbed molecules of the raw material gas on the second film 12. Main processing conditions in the first purge process are, for example, as follows.

Temperature of the substrate W: 100 to 350 degrees C. (particularly 200 degrees C.)
Pressure: 1 to 10 Torr (particularly 5 Torr)
Flow rate of the inert gas: 500 to 5000 sccm (particularly 2000 sccm)
Processing time: 0.3 to 10 seconds (particularly 5 seconds)

In the reaction process, for example, a reaction gas such as a $H_2O$ gas is supplied into the film forming apparatus 300, and molecules of the reaction gas react with the molecules of the raw material gas adsorbed on the second film 12 to form a silicon oxide film (third film 14) on the second film 12. At this time, almost no molecules of the raw material gas exist on the SAM 13, so that the third film 14 is hardly formed on the SAM 13. Main processing conditions in the reaction process are, for example, as follows.

Temperature of the substrate W: 100 to 350 degrees C. (particularly 200 degrees C.)

Pressure: 1 to 10 Torr (particularly 5 Torr)

Flow rate of the reaction gas: 100 to 2000 sccm (particularly 250 sccm)

Processing time: 0.3 to 10 seconds (particularly 1 second)

In the second purge process, an inert gas such as a nitrogen gas is supplied into the film forming apparatus 300 to remove unreacted molecules of the raw material gas and the like on the second film 12. Main processing conditions in the second purge process are the same as the processing conditions in the first purge process described above.

Figure 5:
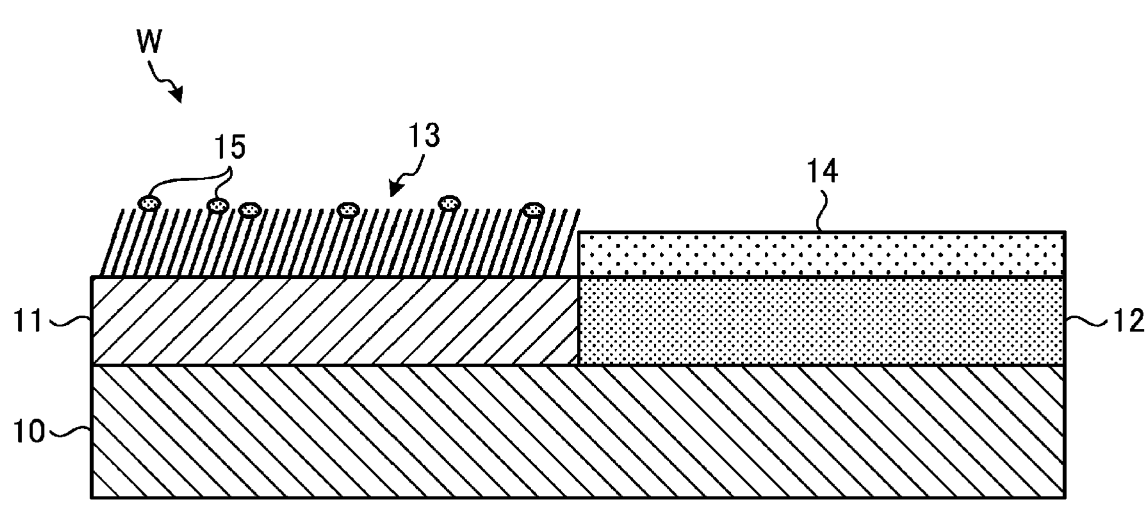
FIG. 5 is a cross-sectional view illustrating an example of the substrate after a third film is formed on a second film according to the first embodiment.

By repeating the ALD cycle including the adsorption process, the first purge process, the reaction process, and the second purge process a predetermined number of times, for example, the third film 14 is formed on the second film 12, as illustrated in FIG. 5. FIG. 5 is a cross-sectional view illustrating an example of the substrate W after the third film 14 is formed according to the first embodiment.

In addition, a region of the SAM 13 on the first film 11 is also exposed to the raw material gas or the reaction gas. Further, the ability of the SAM 13 to prevent the formation of the third film 14 is not perfect. Therefore, nuclei 15 of the third film 14 may be formed on the SAM 13 by repeating the ALD cycle, as illustrated in FIG. 5.

If the ALD cycle is repeated even after the nuclei 15 of the third film 14 are formed on the SAM 13, the nuclei 15 will grow, and eventually, the third film 14 will also be formed on the SAM 13. To prevent this, it is necessary to remove the nuclei 15 formed on the SAM 13 before the nuclei 15 grow to the third film 14. After the processing of step S12 is performed, the substrate W is unloaded from the film forming apparatus 300 and is loaded into the plasma processing apparatus 400 by the transfer mechanism 106.

Figure 6:
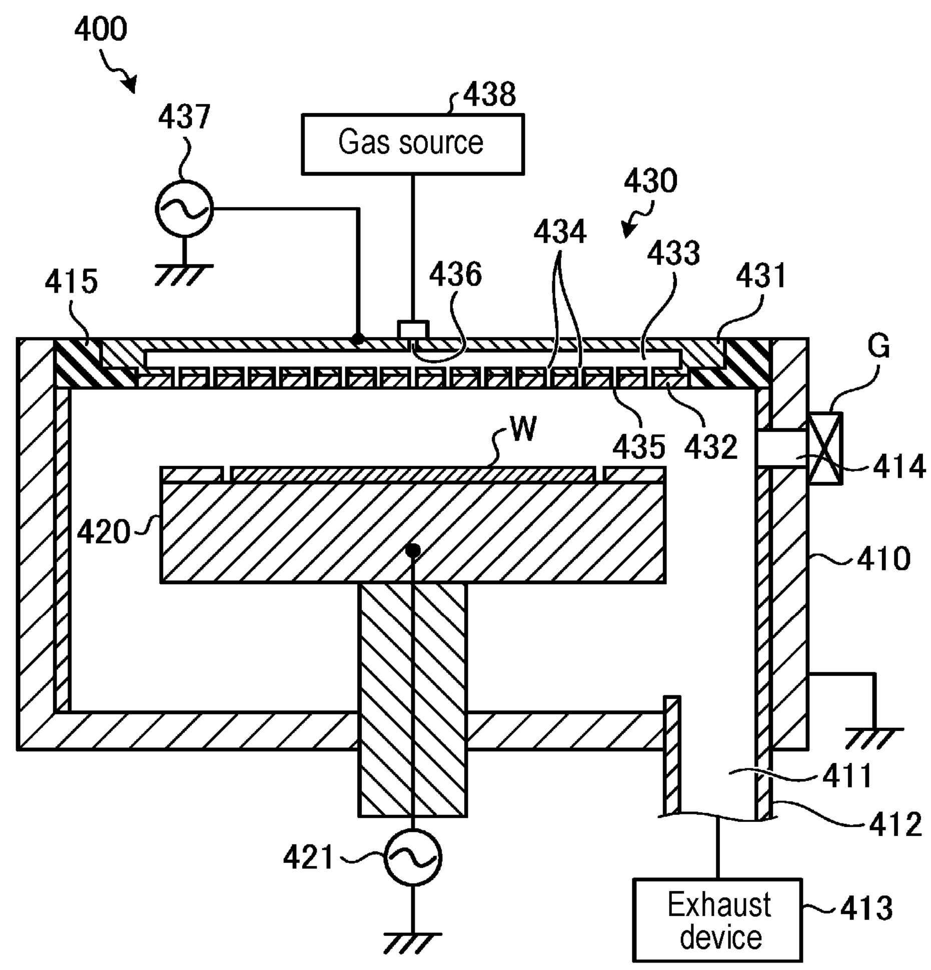
FIG. 6 is a schematic cross-sectional view illustrating an example of a plasma processing apparatus used in a first removal process.

Subsequently, a first removal process is performed (S13). The first removal process of step S13 is performed by the plasma processing apparatus 400 as illustrated in FIG. 6, for example. FIG. 6 is a schematic cross-sectional view illustrating an example of the plasma processing apparatus 400 used in the first removal process. In the present embodiment, the plasma processing apparatus 400 is, for example, a capacitively coupled parallel plate plasma processing apparatus. The plasma processing apparatus 400 includes a processing container 410 having a surface formed of, for example, anodized aluminum, and defining a substantially cylindrical space therein. The processing container 410 is securely grounded.

A substantially cylindrical stage 420 on which the substrate W is placed is provided within the processing container 410. The stage 420 is formed of, for example, aluminum or the like. A radio frequency power supply 421 is connected to the stage 420. The radio frequency power supply 421 supplies radio frequency power of a predetermined frequency (for example, 400 kHz to 13.5 MHz) used for attracting (biasing) ions to the stage 420.

An exhaust port 411 is provided at the bottom of the processing container 410. An exhaust device 413 is connected to the exhaust port 411 via an exhaust pipe 412. The exhaust device 413 has, for example, a vacuum pump such as a turbo molecular pump, and may decompress the interior of the processing container 410 to a desired degree of vacuum.

An opening 414 for loading and unloading the substrate W is formed in a sidewall of the processing container 410. The opening 414 is opened and closed by a gate valve G.

A shower head 430 is provided above the stage 420 so as to face the stage 420. The shower head 430 is supported by the top of the processing container 410 via an insulating member 415. The stage 420 and the shower head 430 are provided within the processing container 410 so as to be substantially parallel to each other.

The shower head 430 has a ceiling plate holder 431 and a ceiling plate 432. The ceiling plate holder 431 has a surface formed of, for example, anodized aluminum, and the ceiling plate 432 is detachably supported by a lower portion of the ceiling plate holder 431.

A diffusion chamber 433 is formed in the ceiling plate holder 431. An inlet 436, which is in communication with the diffusion chamber 433, is formed in the top of the ceiling plate holder 431, and flow paths 434, which are in communication with the diffusion chamber 433, are formed in the bottom of the ceiling plate holder 431. A gas source 438 is connected to the inlet 436 via a pipe. The gas source 438 is a source of a noble gas such as an Ar gas. The noble gas is an example of a processing gas. In addition, the processing gas may include at least one of a noble gas, hydrogen gas, nitrogen gas, and ammonia gas.

Through-holes 435 are formed through the ceiling plate 432 in the thickness direction. One through-hole 435 is in communication with one flow path 434. The noble gas supplied from the gas source 438 into the diffusion chamber 433 through the inlet 436 diffuses within the diffusion chamber 433 and is supplied in a shower form into the processing container 410 through the flow paths 434 and through-holes 435.

A radio frequency power supply 437 is connected to the ceiling plate holder 431 of the shower head 430. The radio frequency power supply 437 supplies radio frequency power of a predetermined frequency used for plasma generation to the ceiling plate holder 431. The frequency of the radio frequency power used for plasma generation is, for example, within the range of 450 kHz to 2.5 GHz. The radio frequency power supplied to the ceiling plate holder 431 is radiated into the processing container 410 from a lower surface of the ceiling plate holder 431. The noble gas supplied into the processing container 410 is plasmatized by the radio frequency power radiated to the processing container 410. Then, the surface of the substrate W is irradiated with active species contained in plasma. Further, ions contained in the plasma are attracted to the surface of the substrate W by the bias power supplied to the stage 420 by the radio frequency power supply 421, and the surface of the substrate W is irradiated with the ions.

By irradiating the substrate W with at least one of ions and active species, the SAM 13 on the first film 11 is excited, and hydrogen and carbon contained in the SAM 13 react with the nuclei 15 of the third film 14 formed on the SAM 13. Then, the nuclei 15 of the third film 14 formed on the SAM 13 become a volatile compound to thereby be removed from the SAM 13. Main processing conditions in the first removal process of step S13 are, for example, as follows.

Temperature of the substrate W: 30 to 350 degrees C. (particularly 200 degrees C.)

Pressure: several mTorr to 100 Torr (particularly 10 mTorr)

Flow rate of the noble gas: 10 to 1000 sccm (particularly 100 sccm)

Radio frequency power for plasma generation: 100 to 5000 W (particularly 2000 W)

Radio frequency power for bias: 10 to 1000 W (particularly 100 W)

Processing time: 1 to 300 seconds (particularly 30 seconds)

Figures 7, 8:
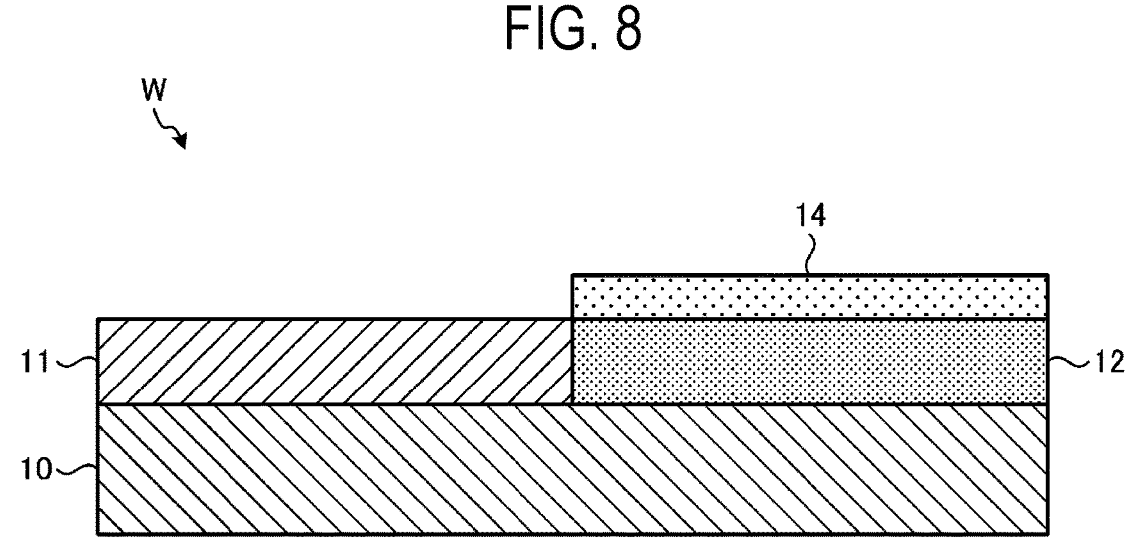
FIG. 7 is a cross-sectional view illustrating an example of the substrate after nuclei of the third film on the SAM are removed according to the first embodiment.
FIG. 8 is a cross-sectional view illustrating an example of the substrate after the SAM on the first film is removed according to the first embodiment.

Thereby, the substrate W reaches, for example, the state as illustrated in FIG. 7. FIG. 7 is a cross-sectional view illustrating an example of the substrate W after the nuclei 15 of the third film 14 on the SAM 13 are removed according to the first embodiment. By irradiating the surface of the substrate W with at least one of ions and active species contained in the plasma, a part of the SAM 13 on the first film 11 is decomposed, and at least one of ions and active species reacts with the nuclei 15 of the third film 14 on the SAM 13, so that the nuclei 15 of the third film 14 on the SAM 13 are removed. On the other hand, the third film 14 is hardly scraped and the film thickness of the third film 14 hardly changes even if the third film 14 is irradiated with at least one of ions and active species. After the processing of step S13 is performed, the substrate W is unloaded from the plasma processing apparatus 400 and is loaded into the plasma processing apparatus 500 by the transfer mechanism 106.

Subsequently, a second removal process is performed (S14). In the second removal process of step S14, for example, plasma of a hydrogen gas is generated in the plasma processing apparatus 500 into which the substrate W is loaded. The plasma processing apparatus 500 may have, for example, the same structure as the plasma processing apparatus 400 described with reference to FIG. 6. Main processing conditions in the second removal process of step S14 are, for example, as follows.

Temperature of the substrate W: 30 to 350 degrees C. (particularly 200 degrees C.)

Pressure: several mTorr to 100 Torr (particularly 50 Torr)

Flow rate of the hydrogen gas: 10 to 1000 sccm (particularly 200 sccm)

Radio frequency power for plasma generation: 100 to 5000 W (particularly 2000 W)

Radio frequency power for bias: 10 to 1000 W (particularly 100 W)

Processing time: 1 to 300 seconds (particularly 30 seconds)

Thus, all the SAM 13 remaining on the first film 11 is removed, and the substrate W reaches, for example, the state as illustrated in FIG. 8. FIG. 8 is a cross-sectional view illustrating an example of the substrate W after the SAM 13 on the first film 11 is removed according to the first embodiment.

Subsequently, it is determined whether or not the processings of steps S11 to S14 were performed a predetermined number of times (S15). The predetermined number of times is the number of times the processings of steps S11 to S14 are repeated until the third film 14 having a predetermined thickness is formed on the second film 12. If steps S11 to S14 were not performed the predetermined number of times (S15: "NO"), the processing indicated by step S11 is performed again.

On the other hand, when steps S11 to S14 were performed the predetermined number of times (S15: "YES"), the substrate W is unloaded from the plasma processing apparatus 500 and is loaded into one of the load lock chambers 102 by the transfer mechanism 106. Then, after the interior of the load lock chamber 102 is returned to the atmospheric pressure, the substrate W is unloaded from the load lock chamber 102 and is returned to the carrier C by the transfer mechanism 108. Then, the film formation method illustrated in this flowchart ends.

Here, if it is attempted to remove the nuclei 15 of the third film 14 formed on the SAM 13 by dry etching using a fluorocarbon-based gas, the nuclei 15 are removed, but the third film 14 formed on the second film 12 is also etched. Therefore, it takes a long time to form the third film 14 having a predetermined thickness on the second film 12, and it is difficult to improve the productivity of semiconductor devices using the substrate W.

In contrast, in the present embodiment, the SAM 13 that does not contain fluorine and contains an alkyl group is selectively formed on the first film 11 in step S11, and the entire substrate W is irradiated with at least one of ions and active species in step S13. Thus, the SAM 13 on the first film 11 is decomposed, and the nuclei 15 of the third film 14 on the SAM 13 become a volatile compound to thereby be removed by hydrogen and carbon contained in the SAM 13.

On the other hand, since the third film 14 formed on the second film 12 has almost no hydrogen and carbon atoms, the third film 14 is hardly etched even if it is irradiated with at least one of ions and active species. Therefore, it is possible to rapidly form the third film 14 having a predetermined thickness on the second film 12, and it is possible to improve the productivity of semiconductor devices using the substrate W.

Further, in the present embodiment, since the SAM 13 that does not contain fluorine is used, it is possible to prevent the substrate W from being damaged by fluorine. Further, in the present embodiment, by using the SAM 13 that does not contain fluorine, it is possible to restrict the content of fluorine contained in the exhaust gas when the SAM 13 is partially decomposed or when the entire SAM 13 is removed. This facilitates the processing of the exhaust gas.

The first embodiment has been described above. As described above, the film formation method according to the present embodiment is a film formation method of selectively forming a film on the substrate W, and includes the preparation process, the first film formation process, the second film formation process, and the first removal process. In the preparation process, the substrate W having the first film 11 and the second film 12 exposed on the surface thereof is prepared. In the first film formation process, the SAM 13 is formed on the first film 11 by supplying, onto the substrate W, a compound for forming a self-assembled monolayer that has a functional group not containing fluorine and containing an alkyl group and prevents formation of the third film 14. In the second film formation process, the third film 14 is formed on the second film 12. In the first removal step, the third film 14 formed near the SAM 13 is removed by applying energy to the surface of the substrate W. Further, the third film 14 is a film that is more likely than the first film 11 to combine with hydrogen and carbon contained in the SAM 13 to form a volatile compound. Thus, it is possible to improve the productivity of semiconductor devices using selective film formation.

Further, in the first removal process according to the above-described embodiment, the nuclei 15 of the third film 14 formed on the SAM 13 are removed by applying energy to the surface of the substrate W. Thus, it is possible to improve the productivity of semiconductor devices using selective film formation.

Further, in the film formation method according to the above-described embodiment, the first film formation process, the second film formation process, and the first removal process are repeated plural times in this order. Thus, it is possible to rapidly form the third film 14 having a desired thickness on the second film 12 by selective film formation.

Further, the film formation method according to the above-described embodiment further includes the second removal process of removing the SAM 13 on the first film 11, which is performed after the first removal process. Further, the first film formation process, the second film formation process, the first removal process, and the second removal process are repeated plural times in this order. Thus, it is possible to rapidly form the third film 14 having a desired thickness on the second film 12 by selective film formation.

Further, in the first removal process according to the above-described embodiment, the surface of the substrate W is exposed to the plasma of the processing gas, and the surface of the substrate W is irradiated with at least one of ions and active species contained in the plasma, so that energy is applied to the surface of the substrate W. The processing gas is a gas including at least one of a noble gas, hydrogen gas, nitrogen gas, and ammonia gas, for example. Thus, it is possible to efficiently irradiate the surface of the substrate W with at least one of ions and active species.

Further, in the above-described embodiment, the first film 11 may be, for example, a metal film, the second film 12 may be, for example, an insulating film, and the third film 14 may be, for example, an oxide film. Thus, it is possible to rapidly form the third film 14 having a desired thickness on the second film 12 by selective film formation.

Further, in the above-described embodiment, the organic compound for forming the SAM 13 is an organic compound including a bonding functional-group that is adsorbed to the surface of the first film 11 and a functional functional-group that does not contain fluorine and contains an alkyl group. Specifically, the organic compound for forming the SAM 13 is, for example, a thiol-based compound, an organic silane-based compound, a phosphonic acid-based compound, or an isocyanate-based compound. Thus, it is possible to selectively form the SAM 13 on the surface of the first film 11.

Second Embodiment

Figure 9:
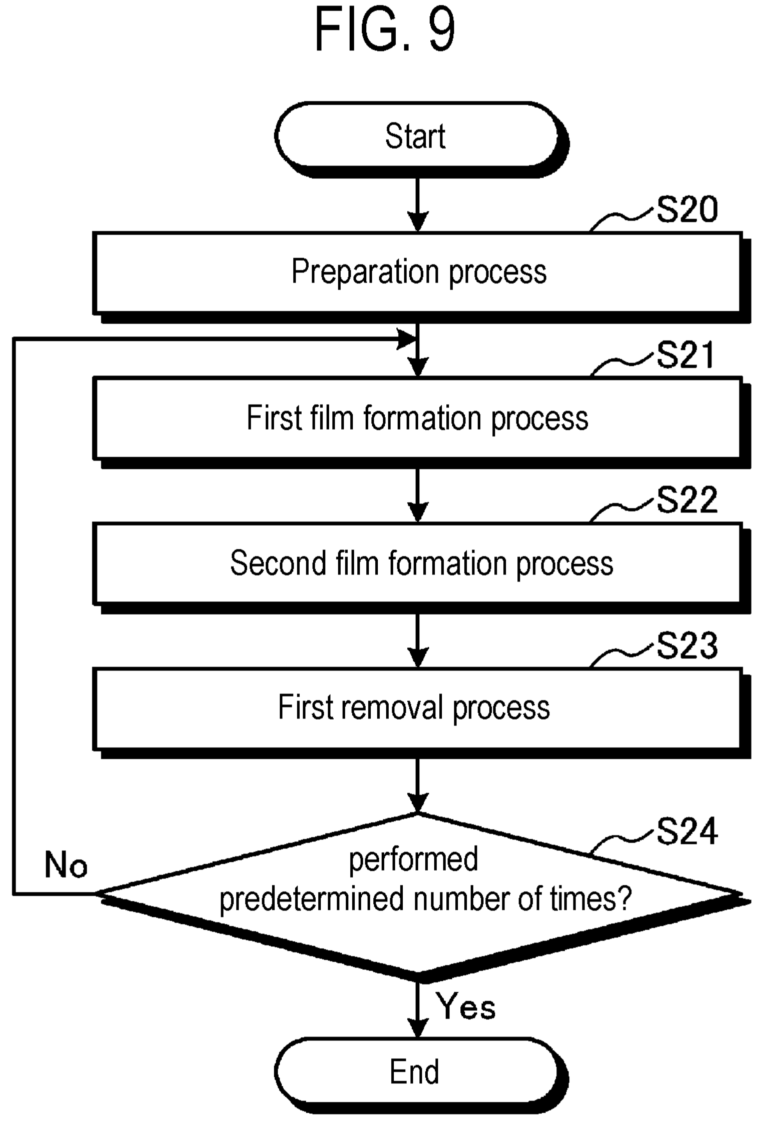
FIG. 9 is a flowchart illustrating an example of a film formation method according to a second embodiment.

FIG. 9 is a flowchart illustrating an example of a film formation method according to a second embodiment. According to the present embodiment, in the substrate W having the first film and the second film exposed on the surface thereof, the third film is selectively formed on the second film by the film formation system 100 illustrated in FIG. 1. The film formation method illustrated in the flowchart of FIG. 9 is realized by controlling each part of the film formation system 100 by the control device 110. Hereinafter, an example of the film formation method according to the second embodiment will be described with reference to FIGS. 10 to 16. In addition, in the film formation method according to the present embodiment, the plasma processing apparatus 500 is not used.

Figure 10:
FIG. 10 is a cross-sectional view illustrating an example of a substrate prepared in a preparation process according to the second embodiment.
Figure 10:
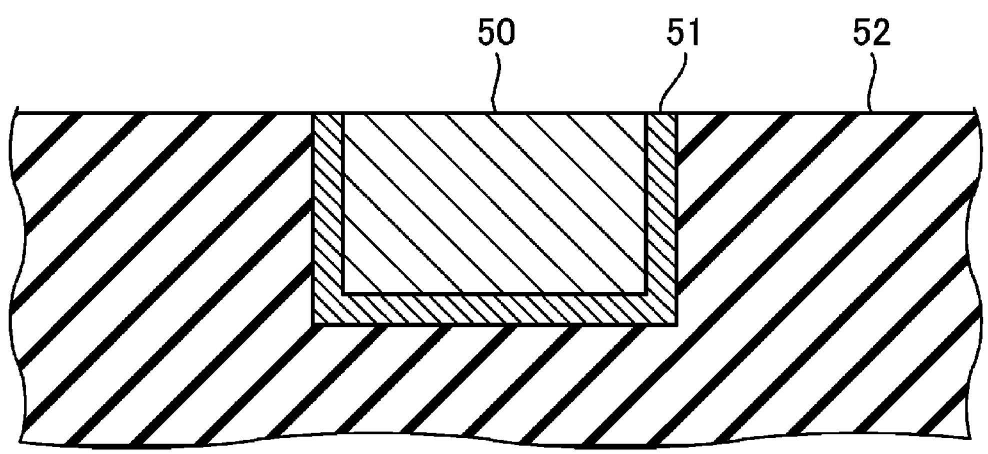

First, a preparation process is performed (S20). In the preparation process of step S20, for example, the substrate W in which a barrier film 51 and a metal wiring 50 are embedded in a recess of an interlayer insulating film 52 formed of a low-k material is prepared, as illustrated in FIG. 10. FIG. 10 is a cross-sectional view illustrating an example of the substrate W prepared in the preparation process according to the second embodiment. The metal wiring 50 is an example of the first film, and the barrier film 51 and the interlayer insulating film 52 are an example of the second film. In the present embodiment, the metal wiring 50 is, for example, copper, the barrier film 51 is, for example, a tantalum nitride, and the interlayer insulating film 52 is, for example, a silicon oxide.

The substrate W prepared in step S20 is accommodated in the carrier C and is set in the port 105. Then, the substrate W is taken out from the carrier C, passes through the alignment chamber 104, and then is loaded into one of the load lock chambers 102 by the transfer mechanism 108. Then, after the interior of the load lock chamber 102 is evacuated, the substrate W is unloaded from the load lock chamber 102 and is loaded into the SAM supply apparatus 200 by the transfer mechanism 106.

Subsequently, a first film formation process is performed (S21). In the first film formation process of step S21, an organic compound gas for forming a SAM is supplied into the SAM supply apparatus 200 into which the substrate W is loaded. For example, a thiol-based compound having a functional group that does not contain fluorine atoms and contains carbon and hydrogen atoms may be used as the organic compound for forming the SAM. Molecules of the organic compound supplied into the SAM supply apparatus 200 are not adsorbed to surfaces of the barrier film 51 and the interlayer insulating film 52 but are adsorbed to a surface of the metal wiring 50 on the substrate W to form a SAM on the metal wiring 50. Main processing conditions in the first film formation process of step S21 are the same as the main processing conditions in the first film formation process of step S11 according to the first embodiment.

Figure 11:
FIG. 11 is a cross-sectional view illustrating an example of the substrate after a SAM is formed on a metal wiring according to the second embodiment.
Figure 11:
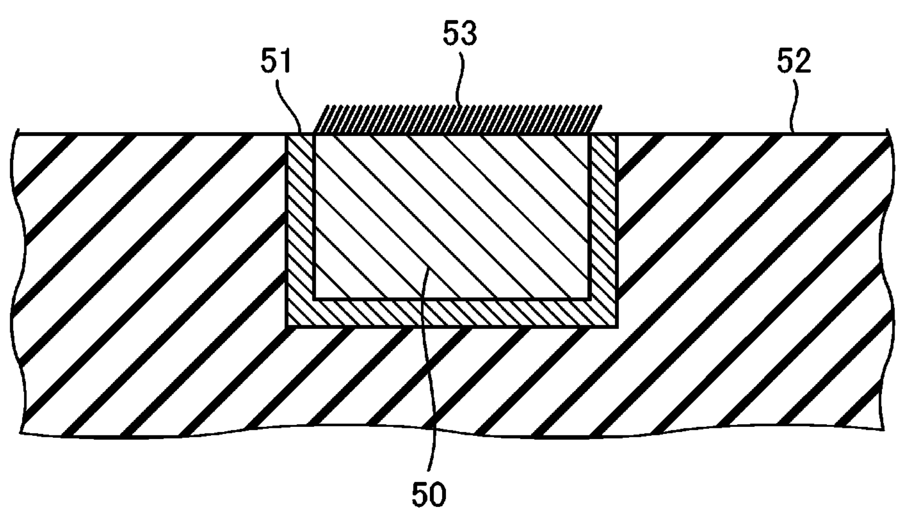

Thus, the substrate W reaches, for example, the state as illustrated in FIG. 11. FIG. 11 is a cross-sectional view illustrating an example of the substrate W after a SAM 53 is formed on the metal wiring 50 according to the second embodiment. After the processing of step S21 is performed, the substrate W is unloaded from the SAM supply apparatus 200 and is loaded into the film forming apparatus 300 by the transfer mechanism 106.

Subsequently, a second film formation process is performed (S22). In the second film formation process of step S22, a dielectric film 54 is formed on the substrate W by ALD in the film forming apparatus 300 into which the substrate W is loaded. The dielectric film 54 is an example of the third film. In the present embodiment, the dielectric film 54 is, for example, an aluminum oxide. In ALD, an ALD cycle including an adsorption process, a first purge process, a reaction process, and a second purge process is performed a predetermined number of times.

In the adsorption process, a raw material gas such as trimethylaluminum (TMA) is supplied into the film forming apparatus 300. Thus, molecules of the raw material gas are chemically adsorbed to the surfaces of the barrier film 51 and the interlayer insulating film 52. However, the molecules of the raw material gas are hardly adsorbed onto the SAM 53. Main processing conditions in the adsorption process are, for example, as follows.

Temperature of the substrate W: 80 to 250 degrees C. (particularly 150 degrees C.)

Pressure: 0.1 to 10 Torr (particularly 3 Torr)

Flow rate of the raw material gas: 1 to 300 sccm (particularly 50 sccm)

Processing time: 0.1 to 5 seconds (particularly 0.2 seconds)

In the first purge process, a noble gas such as an argon gas or an inert gas such as a nitrogen gas is supplied into the film forming apparatus 300 to remove the excessively adsorbed molecules of the raw material gas on the barrier film 51 and the interlayer insulating film 52. Main processing conditions in the first purge process are, for example, as follows.

Temperature of the substrate W: 80 to 250 degrees C. (particularly 150 degrees C.)

Pressure: 0.1 to 10 Torr (particularly 3 Torr)

Flow rate of the inert gas: 5 to 15 slm (particularly 10 slm)

Processing time: 0.1 to 15 seconds (particularly 2 seconds)

In the reaction process, for example, a reaction gas such as a $H_2O$ gas is supplied into the film forming apparatus 300. Thus, molecules of the reaction gas react with the molecules of the raw material gas adsorbed onto the barrier film 51 and the interlayer insulating film 52, forming an aluminum oxide film (dielectric film 54) on the barrier film 51 and the interlayer insulating film 52. At this time, almost no molecules of the raw material gas exist on the SAM 53, so that the dielectric film 54 is hardly formed on the SAM 53. Main processing conditions in the reaction process are, for example, as follows.

Temperature of the substrate W: 80 to 250 degrees C. (particularly 150 degrees C.)

Pressure: 0.1 to 10 Torr (particularly 3 Torr)

Flow rate of the reaction gas: 10 to 500 sccm (particularly 100 sccm)

Processing time: 0.1 to 5 seconds (particularly 0.5 seconds)

In the second purge process, a noble gas such as an argon gas or an inert gas such as a nitrogen gas is supplied into the film forming apparatus 300 to remove unreacted molecules of the raw material gas and the like on the second film 12. Main processing conditions in the second purge process are the same as the processing conditions in the first purge process described above.

Figure 12:
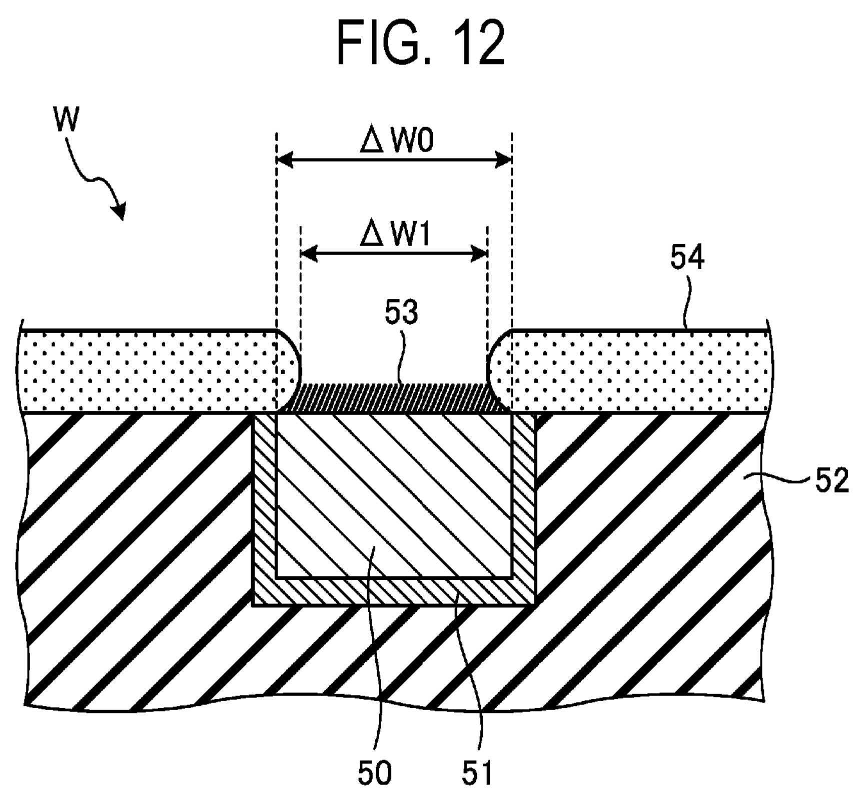
FIG. 12 is a cross-sectional view illustrating an example of the substrate after a dielectric film is formed according to the second embodiment.

By repeating the ALD cycle including the adsorption process, the first purge process, the reaction process, and the second purge process a predetermined number of times, for example, the dielectric film 54 is formed on the barrier film 51 and the interlayer insulating film 52, as illustrated in FIG. 12. FIG. 12 is a cross-sectional view illustrating an example of the substrate W after the dielectric film 54 is formed according to the second embodiment.

Here, a region of the SAM 53 on the metal wiring 50 is also exposed to the raw material gas or the reaction gas. Further, the ability of the SAM 53 to prevent the formation of the dielectric film 54 is not perfect. Therefore, nuclei of the dielectric film 54 may be formed on the SAM 53 by repeating the ALD cycle, for example, as illustrated in FIG. 5. Further, in the process of growing the dielectric film 54 by repeating the ALD cycle, the dielectric film 54 also grows laterally, and a part of the dielectric film 54 protrudes into a region of the metal wiring 50, for example, as illustrated in FIG. 12. Thus, the width of an opening of the dielectric film 54 becomes a width ΔW1 less than a width ΔW0 of the region of the metal wiring 50.

Subsequently, a first removal process is performed (S23). In the first removal process of step S23, energy is applied to the surface of the substrate W. In the first removal process of the present embodiment, the substrate W is exposed to plasma generated by plasmatizing the processing gas, and the surface of the substrate W is irradiated with ions and active species contained in the plasma, so that energy is applied to the surface of the substrate W. The first removal process of the present embodiment is performed by the plasma processing apparatus 400, for example, as illustrated in FIG. 6. In addition, the plasma processing apparatus 400 of the present embodiment may not be provided with the radio frequency power supply 421.

The processing gas is plasmatized, and the substrate W is irradiated with at least one of ions and active species contained in the plasma, so that the SAM 53 on the metal wiring 50 is excited. Thus, hydrogen and carbon contained in the SAM 53 react with the nuclei of the dielectric film 54 formed on the SAM 53, so that the nuclei of the dielectric film 54 become a volatile compound to thereby be removed from the SAM 53.

Further, the SAM 53 adjacent to the dielectric film 54 is excited by irradiating the substrate W with at least one of ions and active species contained in the plasma, causing the generation of active species having hydrogen and carbon contained in the SAM 53. Then, the active species having hydrogen and carbon react with a side portion of the dielectric film 54 adjacent to the SAM 53. Thus, the side portion of the dielectric film 54 protruding into the region of the metal wiring 50 becomes a volatile compound to thereby be removed.

Figure 13:
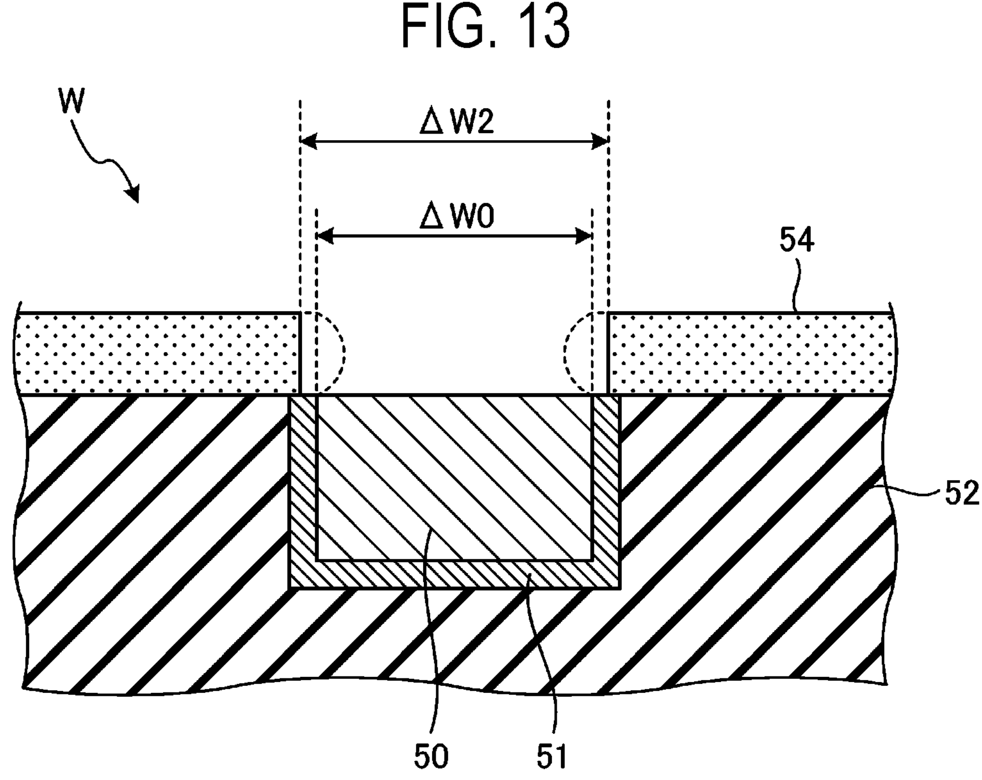
FIG. 13 is a cross-sectional view illustrating an example of the substrate after the SAM is removed according to the second embodiment.

Thus, for example, the width of the opening of the dielectric film 54 is increased to a width ΔW2 greater than the width ΔW0 of the region of the metal wiring 50, as illustrated in FIG. 13. FIG. 13 is a cross-sectional view illustrating an example of the substrate W after the SAM 53 is removed according to the second embodiment. Thus, when a via connected to the metal wiring 50 is formed in the opening of the dielectric film 54 in a subsequent process, the width of the via may be made greater than the width of the metal wiring 50, and an increase in the resistance value of the via may be prevented. In addition, since the active species generated by exciting the SAM 53 have a short lifespan, and therefore, are deactivated before reaching an upper surface of the dielectric film 54. Therefore, the upper surface of the dielectric film 54 is hardly etched by the active species generated by exciting the SAM 53.

In the present embodiment, the processing gas used in step S23 is a hydrogen gas, for example. In addition, a gas including at least one of a noble gas, hydrogen gas, nitrogen gas, and ammonia gas may be used as the processing gas. In addition, the SAM 53 on the metal wiring 50 is removed by performing step S23. Therefore, in the present embodiment, the second removal process for removing the SAM 53 is not performed.

Main processing conditions in the first removal process of step S23 are, for example, as follows.

Temperature of the substrate W: 50 to 300 degrees C. (particularly 150 degrees C.)

Pressure: 0.1 Torr to 50 Torr (particularly 2 Torr)

Flow rate of the processing gas: 200 to 3000 sccm (particularly 1000 sccm)

Radio frequency power for plasma generation: 50 to 1000 W (particularly 200 W)

Processing time: 1 to 60 seconds (particularly 10 seconds)

Figure 14:
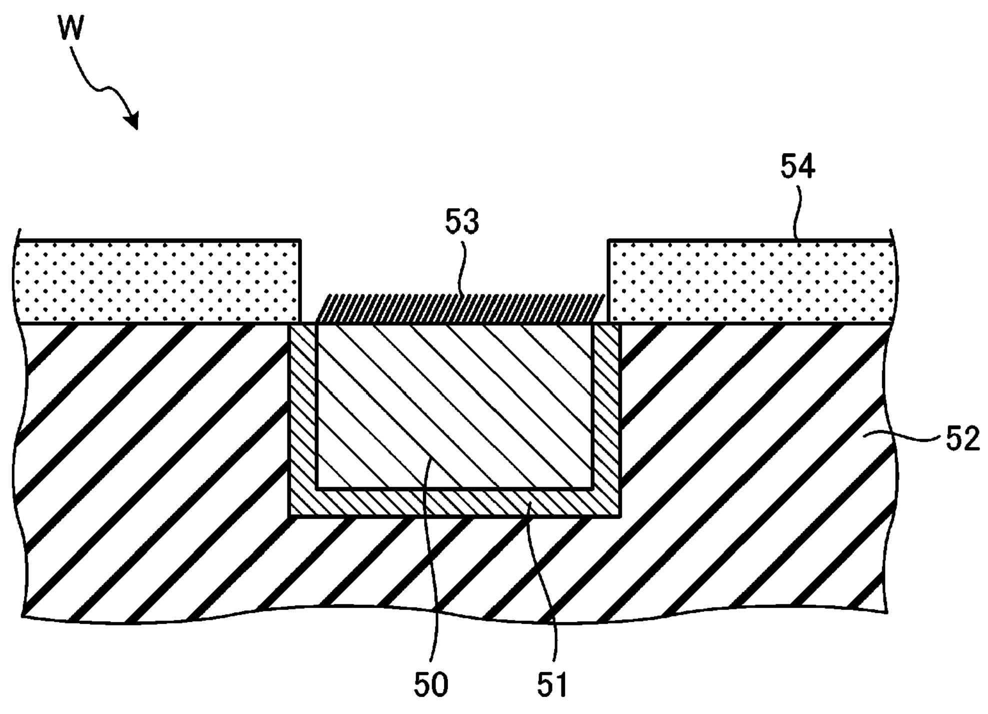
FIG. 14 is a cross-sectional view illustrating an example of the substrate after a SAM is further formed on the metal wiring according to the second embodiment.

Subsequently, it is determined whether or not the processings of steps S21 to S23 were performed a predetermined number of times (S24). The predetermined number of times is the number of times the processings of steps S21 to S23 are repeated until the dielectric film 54 having a predetermined thickness is formed on the interlayer insulating film 52. If steps S21 to S23 were not performed a predetermined number of times (S24: "NO"), the processing indicated by step S21 is performed again, so that the SAM 53 is formed on the surface of the metal wiring for example, as illustrated in FIG. 14.

Figure 15:
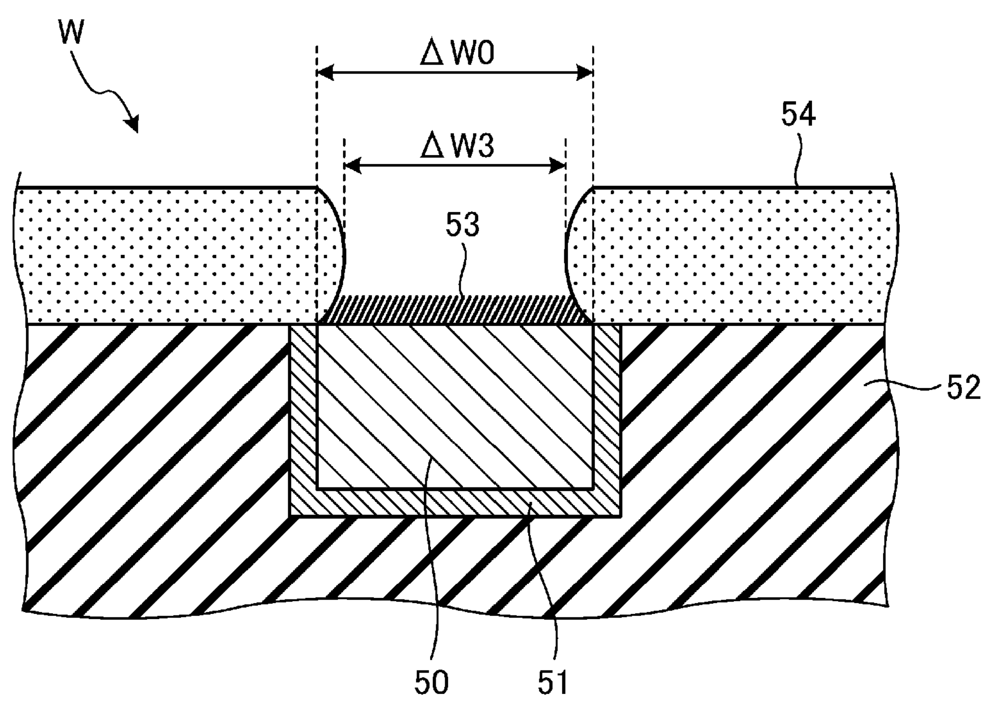
FIG. 15 is a cross-sectional view illustrating an example of the substrate after a dielectric film is further formed on the dielectric film according to the second embodiment.

Then, the dielectric film 54 is further formed on the barrier film 51 and the dielectric film 54 by performing the processing indicated by step S22 again. Thus, for example, as illustrated in FIG. 15, a part of the dielectric film 54 protrudes again into the region of the metal wiring 50, and the width of the opening of the dielectric film 54 becomes a width ΔW3 less than the width ΔW0 of the region of the metal wiring 50.

Figure 16:
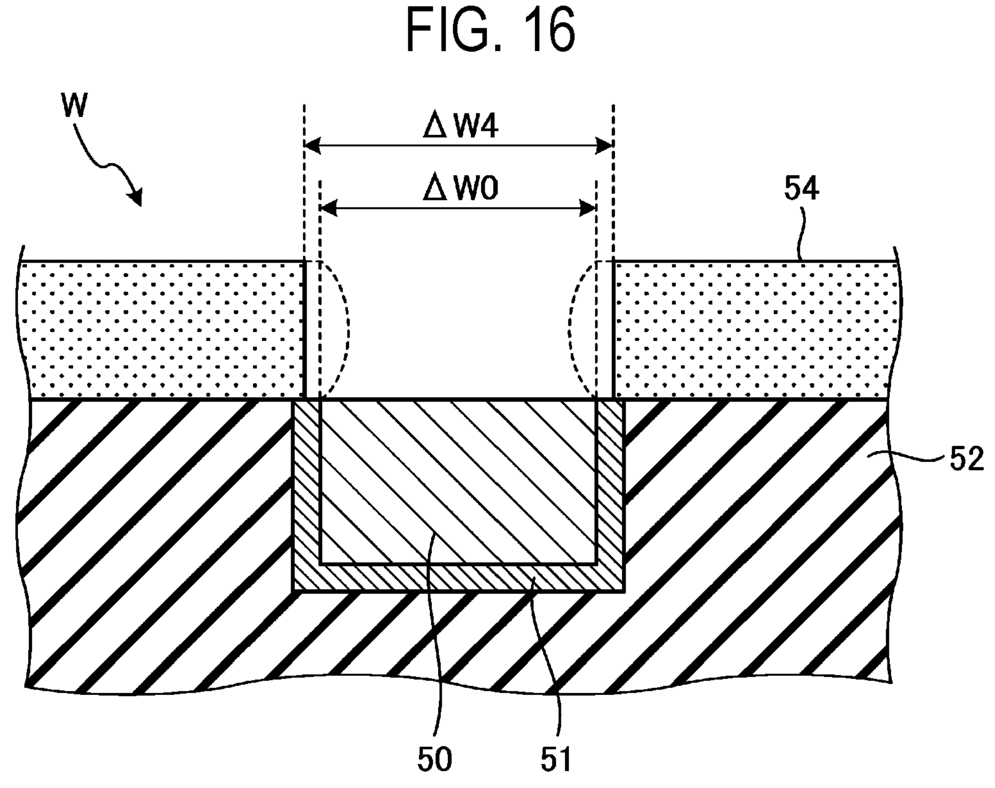
FIG. 16 is a cross-sectional view illustrating an example of the substrate after the SAM is removed according to the second embodiment.

Then, by performing the processing indicated by step S23 again, the nuclei of the dielectric film 54 on the SAM 53 and the side portion of the dielectric film 54 protruding into the region of the metal wiring 50 are removed by active species having hydrogen and carbon contained in the SAM 53. Thus, for example, as illustrated in FIG. 16, the width of the opening of the dielectric film 54 is increased to a width ΔW4 greater than the width ΔW0 of the region of the metal wiring 50.

In this way, by repeating steps S21 to S23, it is possible to form the dielectric film 54 having an arbitrary thickness around the metal wiring 50 while maintaining the width of the opening of the dielectric film 54 greater than the width ΔW0 of the region of the metal wiring 50.

The second embodiment has been described above. In the first removal process according to the present embodiment, the side portion of the dielectric film 54 adjacent to the SAM 53 is removed by applying energy to the surface of the substrate W. Thus, it is possible to make the width of the opening of the dielectric film 54 be greater than the width of the region of the metal wiring 50.

Further, in the first removal process according to the present embodiment, when the surface of the substrate W is exposed to the plasma of the processing gas, the surface of the substrate W is irradiated with at least one of ions and active species contained in the plasma. The processing gas is a gas including at least one of a noble gas, hydrogen gas, nitrogen gas, and ammonia gas, for example. Thus, it is possible to efficiently irradiate the surface of the substrate W with at least one of ions and active species.

[Others]

In addition, the technology disclosed herein is not limited to the above-described embodiments, and various modifications are possible within the scope of the gist thereof.

For example, the third film 14 is formed by ALD in the second film formation process of step S12 in the above-described first embodiment, but the disclosed technique is not limited thereto. As another example, the third film 14 may be formed by chemical vapor deposition (CVD) in the second film formation process of step S12.

Further, in step S13 of the first embodiment and step S23 of the second embodiment described above, the substrate W is exposed to the plasma generated by plasmatizing the processing gas, and the surface of the substrate W is irradiated with ions and active species contained in the plasma. Thus, energy is applied to the surface of the substrate W. However, the disclosed technology is not limited to this. The method of applying energy to the surface of the substrate W may be a method of heating the surface of the substrate W, a method of irradiating the surface of the substrate W with ultraviolet rays, or the like. Further, when irradiating the surface of the substrate W with ions, for example, a focused ion beam device or the like may be used instead of the plasma.

Further, in the above-described first embodiment, the film formation system 100 is provided with one SAM supply apparatus 200, one film forming apparatus 300, one plasma processing apparatus 400, and one plasma processing apparatus 500, but the disclosed technology is not limited thereto. For example, the plasma processing apparatus 400 and the plasma processing apparatus 500 may be realized by one plasma processing apparatus. Further, for example, the film formation system 100 may be provided with plural apparatuses for performing a processing that takes the most time, and the other processings may be realized by a single apparatus. For example, if the processing of step S11 takes a long time, plural SAM supply apparatuses 200 may be provided to perform the processing of step S11, and one apparatus may be provided to perform the processings of S12 to S14. Thus, the processing waiting time when processing substrates W may be reduced.

Figure 17:
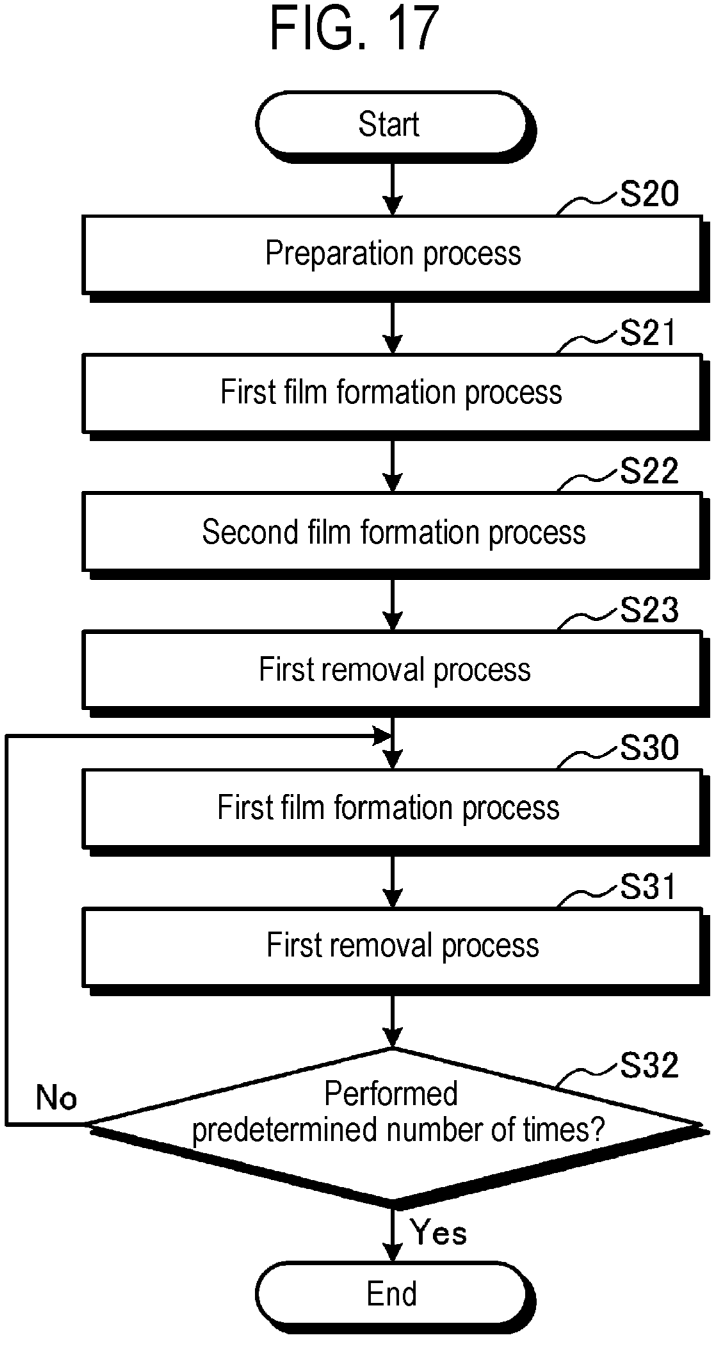
FIG. 17 is a flowchart illustrating another example of the film formation method according to the second embodiment.

Further, in the above-described second embodiment, the first film formation process, the second film formation process, and the first removal process are repeatedly performed in this order, but the disclosed technology is not limited thereto. For example, as illustrated in FIG. 17, after the first film formation process S21, the second film formation process S22, and the first removal process S23 are performed, a first film formation process S30 and a first removal process S31 may be performed one or more times in this order. FIG. 17 is a flowchart illustrating another example of the film formation method according to the second embodiment. A processing performed in the first film formation process of step S30 is the same as the processing performed in the first film formation process of step S21, and a processing performed in the first removal process of step S31 is the same as the processing performed in the first removal process of step S23. In the film formation method illustrated in FIG. 17, the dielectric film 54 having a sufficient thickness is formed in the second film formation process of step S22. Then, by repeating the first film formation process of step S30 and the first removal process of step S31, the width of the opening of the dielectric film 54 may be made greater than the width of the region of the metal wiring 50.

Further, for example, as illustrated in FIG. 18, a processing S33 of determining whether or not the processings of S21 to S23 and the processings of S30 to S32 were repeated a predetermined number of times may be performed. Thus, it is possible to prevent the film thickness of the dielectric film 54 from being excessively increased to block the opening of the dielectric film 54 in step S22.

In addition, the embodiments disclosed herein should be considered to be exemplary and not limitative in all respects. In fact, the above embodiments may be implemented in various forms. Further, the above embodiments may be omitted, replaced or modified in various embodiments without departing from the scope of the appended claims and their gist.

EXPLANATION OF REFERENCE NUMERALS

C: carrier, G: gate valve, W: substrate, 10: base material, 11: first film, 12: second film, 13: SAM, 14: third film, 15: nuclei, 100: film formation system, 101: vacuum transfer chamber, 102: load lock chamber, 103: atmospheric transfer chamber, 104: alignment chamber, 105: port, 106: transfer mechanism, 107: arm, 108: transfer mechanism, 110: control device, 200: SAM supply apparatus, 300: film forming apparatus, 400: plasma processing apparatus, 410: processing container, 411: exhaust port, 412: exhaust pipe, 413: exhaust device, 414: opening, 415: insulating member, 420: stage, 421: radio frequency power supply, 430: shower head, 431: ceiling plate holder, 432: ceiling plate, 433: diffusion chamber, 434: flow path, 435: through-hole, 436: inlet, 437: radio frequency power supply, 438: gas source, 500: plasma processing apparatus, 50: metal wiring, 51: barrier film, 52: interlayer insulating film, 53: SAM, 54: dielectric film

What is claimed is:

1. A film formation method of selectively forming a film on a substrate, the method comprising:

a preparation process of preparing the substrate having a first film and a second film exposed on a surface of the substrate;

a first film formation process of forming a self-assembled monolayer on the first film by supplying, onto the substrate, a compound for forming the self-assembled monolayer that has a functional group not containing fluorine and containing an alkyl group and prevents formation of a third film;

a second film formation process of forming the third film on the second film; and a first removal process of removing the third film formed in a vicinity of the self-assembled monolayer by applying energy to the surface of the substrate, wherein the third film is a film that is more likely than the first film to combine with hydrogen and carbon contained in the self-assembled monolayer to form a volatile compound.

2. The film formation method of claim 1, wherein in the first removal process, nuclei of the third film formed on the self-assembled monolayer are removed by applying energy to the surface of the substrate.

3. The film formation method of claim 2, wherein the first film formation process, the second film formation process, and the first removal process are repeated plural times in this order.

4. The film formation method of claim 3, wherein in the first removal process, the surface of the substrate is exposed to plasma of a processing gas, and the surface of the substrate is irradiated with at least one of ions and active species contained in the plasma, so that energy is applied to the surface of the substrate.

5. The film formation method of claim 4, wherein the processing gas includes at least one of a noble gas, hydrogen gas, nitrogen gas, and ammonia gas.

6. The film formation method of claim 5, wherein the first film is a metal film, the second film is an insulating film, and the third film is an oxide film.

7. The film formation method of claim 6, wherein the compound for forming the self-assembled monolayer has a binding functional-group that is adsorbed to a surface of the first film and a functional functional-group that does not contain fluorine and contains an alkyl group.

8. The film formation method of claim 7, wherein the compound for forming the self-assembled monolayer is a thiol-based compound, an organosilane-based compound, a phosphonic acid-based compound, or an isocyanate-based compound.

9. The film formation method of claim 1, wherein in the first removal process, a side portion of the third film adjacent to the self-assembled monolayer is removed by applying energy to the surface of the substrate.

10. The film formation method of claim 1, wherein the first film formation process, the second film formation process, and the first removal process are repeated plural times in this order.

11. The film formation method of claim 1, wherein after the first film formation process, the second film formation process and the first removal process are performed, the first film formation process and the first removal process are performed one or more times in this order.

12. The film formation method of claim 1, further comprising a second removal process of removing the self-assembled monolayer on the first film, the second removal process being performed after the first removal process, wherein the first film formation process, the second film formation process, the first removal process, and the second removal process are repeated plural times in this order.

13. The film formation method of claim 1, wherein in the first removal process, the surface of the substrate is exposed to plasma of a processing gas, and the surface of the substrate is irradiated with at least one of ions and active species contained in the plasma, so that energy is applied to the surface of the substrate.

14. The film formation method of claim 1, wherein the first film is a metal film, the second film is an insulating film, and the third film is an oxide film.

15. The film formation method of claim 1, wherein the compound for forming the self-assembled monolayer has a binding functional-group that is adsorbed to a surface of the first film and a functional functional-group that does not contain fluorine and contains an alkyl group.

* * * * *